(12) United States Patent
Coumou

(10) Patent No.: US 6,559,650 B2
(45) Date of Patent: May 6, 2003

(54) RF POWER PROBE HEAD WITH A THERMALLY CONDUCTIVE BUSHING

(75) Inventor: David J. Coumou, Webster, NY (US)

(73) Assignee: ENI Technology, Inc., Rochester, NY (US)

(*) Notice: Subject to any disclaimer, the term of this patent is extended or adjusted under 35 U.S.C. 154(b) by 0 days.

(21) Appl. No.: 09/874,439

(22) Filed: Jun. 5, 2001

(65) Prior Publication Data
US 2002/0180450 A1 Dec. 5, 2002

(51) Int. Cl.[7] .................................. G01N 27/62
(52) U.S. Cl. .................. 324/468; 315/111.21
(58) Field of Search ............... 324/468; 315/111.21, 315/111.51; 219/121.21, 121.36; 156/345.48; 118/723 R, 715; 174/152; 29/428

(56) References Cited

U.S. PATENT DOCUMENTS 5,770,922 A    6/1998  Gerrish et al. ........ 315/111.21
5,972,434 A  * 10/1999  Kajander ................ 427/389.8
6,209,480 B1 *  4/2001  Moslehi .................. 118/723 I

* cited by examiner

Primary Examiner—N. Le
Assistant Examiner—Amy He
(74) Attorney, Agent, or Firm—Harness, Dickey & Pierce, P.L.C.

(57) ABSTRACT

A probe interface for an RF probe head improves the dissipation of heat resulting from RF power. The interface includes a conductor for transmitting RF power to a plasma chamber, and a sensing board for generating an analog signal based on the RF power. An electrically insulative bushing is disposed between the conductor and the sensing board, where the bushing is thermally conductive such that the bushing dissipates heat resulting from the RF power. By enabling the bushing to be thermally conductive, thermal instability is reduced and the overall RF power handling capacity increases.

16 Claims, 4 Drawing Sheets

RF POWER PROBE HEAD WITH A THERMALLY CONDUCTIVE BUSHING

FIELD OF THE INVENTION

The present invention generally relates to semiconductor plasma etching. More particularly, the invention relates to a probe interface and method for measuring radio frequency (RF) power delivered to a plasma chamber that improves the dissipation of heat resulting from the RF power.

BACKGROUND OF THE INVENTION

In the semiconductor industry, plasma etching has become an integral part of the manufacture of semiconductor circuits. Plasma etching, which uses ions accelerated by an electric field, tends to etch only horizontal exposed surfaces and therefore avoids undercutting. A typical plasma etching system will include a plasma chamber (containing the silicon wafer to be etched), a power delivery system, and a feedback system for providing closed loop control of the RF power delivered to the plasma chamber. The feedback system typically includes a probe head that generates analog signals based on the RF power flowing through a conductor and a probe analysis system that processes the analog signals into useful data such as voltage magnitude, current magnitude, and relative phase digital data.

It is important to note that the probe head is relatively small in size in comparison to the plasma chamber and the power delivery system. It is common for a probe head to include a housing containing a probe "interface", where the probe interface is made up of the conductor, sensing boards and an electrically insulative bushing. The conductor is placed in series with the power line connected between the power delivery system and the plasma chamber. Thus, the conductor participates in transmitting the RF power to the plasma chamber. The sensing boards typically include a voltage pick-up board and a current pick-up board for generating a voltage analog signal and a current analog signal based on the RF power flowing through the conductor.

The bushing is inserted over the conductor and is electrically insulative in order to prevent electric shock to individuals touching the housing. The bushing also helps to minimize electrical losses. To serve this purpose, the conventional bushing is made of polytetraflouethylene (PTFE—commercially known as Teflon), which has a dielectric constant of approximately 2.85. Thus, the relatively low dielectric constant (i.e., high dielectric strength) enables the bushing to be an electrical insulator between the conductor and the sensing boards.

While the above-described probe interface has been effective in the past, there remains considerable room for improvement. For example, as the size of silicon wafers increases (as well as the frequency of the RF power), the amount of RF power needed also increases. The electrical current associated with the power generates heat in the conductor. On the other hand, the semiconductor industry also requires small probe heads. Thus, the conductor cannot be increased in size to account for the increase in current. The result is often a greater occurrence of thermal instability and a limited power handling capacity. In fact, Teflon has a relatively low thermal conductivity of approximately 0.41 watts per meter per degree Kelvin and causes the bushing to act as a thermal insulator to the conductor. The thermal characteristics of Teflon are discussed in greater detail in "Thermal Conductivity of PTFE and PTFE Composites", D. M. Price et al., Proceedings of the 28th Conference of the North American Thermal Analysis Society, Oct. 4–6, 2000, pp. 579–584. It is therefore desirable to provide a probe interface bushing that can more effectively dissipate heat resulting from RF power.

The above and other objectives are provided by a probe interface for an RF probe head in accordance with the present invention. The interface includes a conductor for transmitting RF power to a plasma chamber, and a sensing board for generating an analog signal based on the RF power. An electrically insulative bushing is disposed between the conductor and the sensing board, where the bushing is thermally conductive such that the bushing dissipates heat resulting from the RF power. By enabling the bushing to be thermally conductive, thermal instability is reduced and the overall RF power handling capacity increases.

Further in accordance with the present invention, an electrically insulative bushing for an RF probe head interface is provided. The bushing includes a thermally conductive material, and a binder material dispersed throughout the conductive material. The materials combine to provide a predetermined level of thermal conductivity. In the preferred embodiment, the conductive material includes a ceramic material such a boron nitride.

In another aspect of the invention, a method for measuring RF power delivered to a plasma chamber is provided. The method includes the step of transmitting the RF power to the plasma chamber via a conductor. A sensing board is used to generate an analog signal based on the RF power. The method further provides for disposing an electrically insulative bushing between the conductor and the sensing board, where the bushing is thermally conductive such that the bushing dissipates heat resulting from the RF power.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute part of this specification. The drawings illustrate various features and embodiments of the invention, and together with the description serve to explain the principles and operation of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
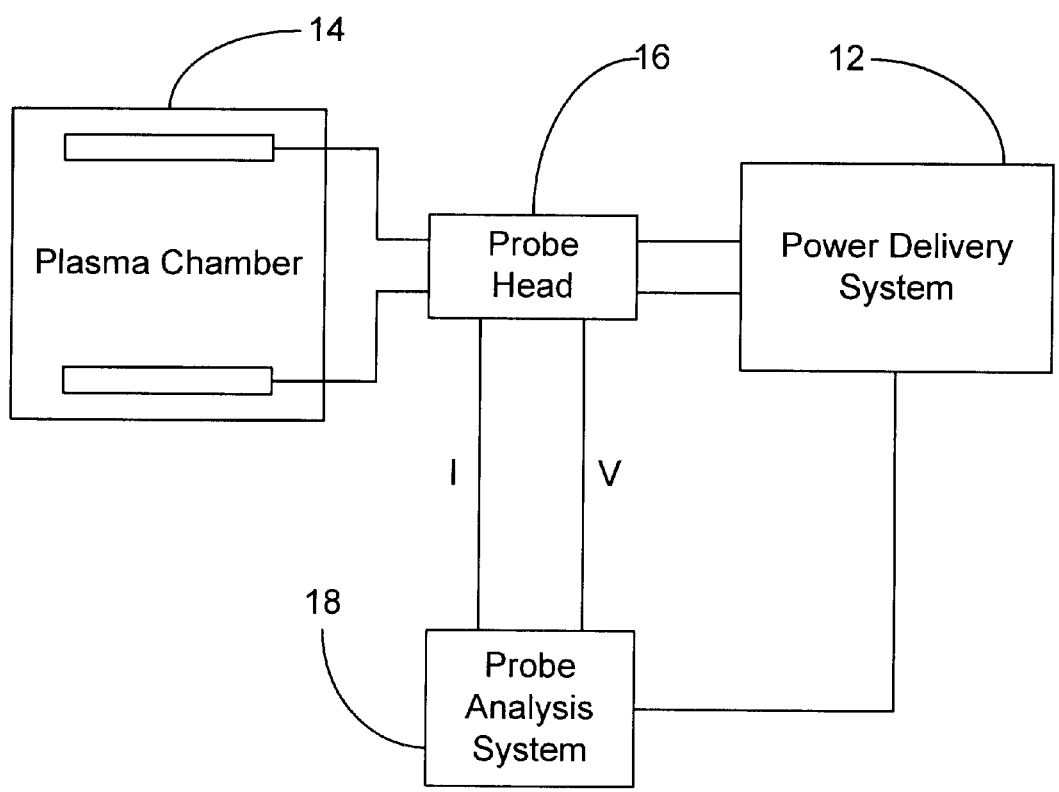
FIG. 1 is a block diagram of a plasma etching system, useful in understanding the invention.

Turning now to FIG. 1, a block diagram of a typical plasma etching system is shown generally at 10. The plasma etching system 10 is able to etch a silicon wafer or other workpiece (not shown) contained in a plasma chamber 14. It can be seen that the etching system 10 has a radio frequency (RF) power delivery system 12, which produces RF power at a predescribed frequency (e.g., 13.56 megaHertz) at a predetermined power level (e.g., 1 kilowatt). The output of the delivery system 12 is coupled by a power conduit to an input of the plasma chamber 14. In order to more effectively control the output of the delivery system 12, a probe head 16 and probe analysis system 18 are used. The probe head generates analog signals based on the RF power flowing through a conductor contained within the probe head 16. The probe analysis system 18 processes the analog signals into useful data such as voltage magnitude, current magnitude, and relative phase digital data. This digital data can be used by the delivery system 12 as feedback.

It should be noted that while the present invention will primarily be described with respect to plasma etching, the invention is not so limited. In fact, any system using RF power can benefit from the features of the invention. Specific examples are therefore used for discussion purposes only.

Figure 2:
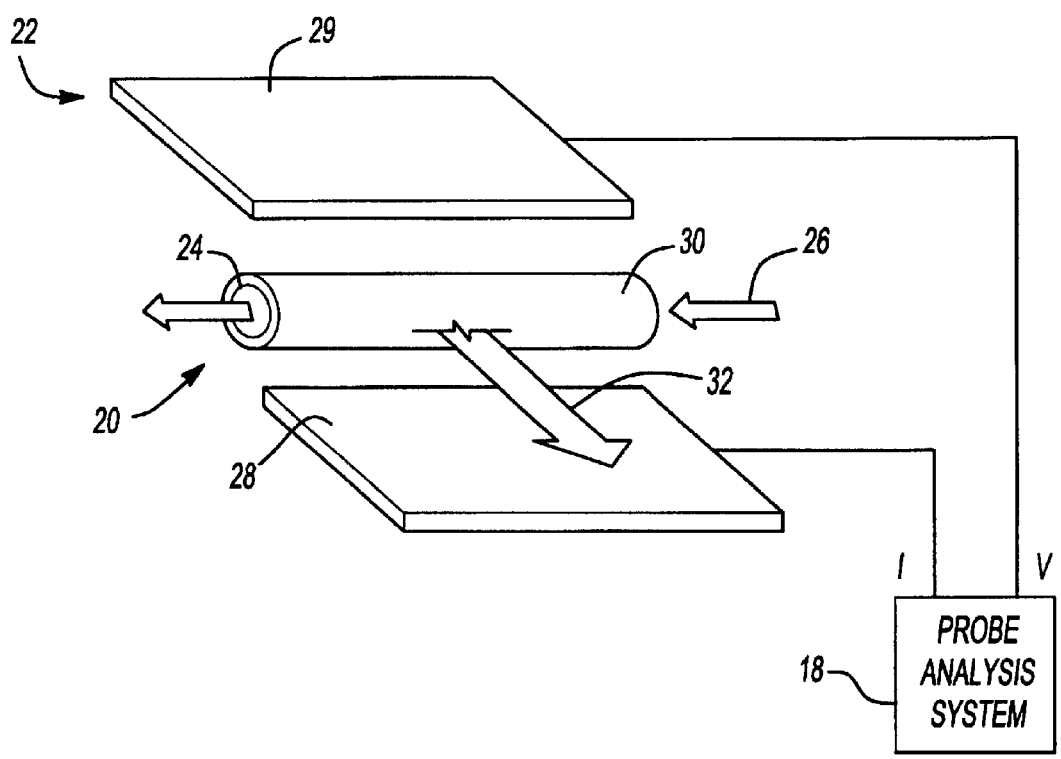
FIG. 2 is an exploded perspective view of a probe interface in accordance with the principles of the present invention.

Turning now to FIG. 2, a plurality of probe interfaces is shown in greater detail. It can be seen that the preferred embodiment generally has a current probe interface 20 and a voltage probe interface 22, but two interfaces are not required. Specifically, the current probe interface 20 includes a conductor 24 for transmitting RF power 26 into the plasma chamber 14 (FIG. 1). A sensing board such as current pick-up board 28 generates an analog signal based on the RF power 26. It can further be seen that an electrically insulative bushing 30 is disposed between the conductor 24 and the current pick-up board 28. The bushing 30 is thermally conductive such that the bushing 30 dissipates heat 32 resulting from the RF power 26. By dissipating the heat 32 with a thermally conductive bushing 30 as opposed to containing the heat 32 within the conductor 24, the thermal stability and overall power handling capacity are significantly improved.

Similarly, the voltage probe interface 22 is made up of the conductor 24, a voltage pick-up board 29 and the bushing 30. The voltage pickup board also generates an analog signal based on the RF power 26. Generation of the analog signals can be accomplished in any number of ways including magnetic and/or capacitance circuitry. U.S. Pat. No. 5,770,922 to Gerrish et al., incorporated herein by reference, describes a typical approach to signal generation and processing in greater detail.

Figure 3:
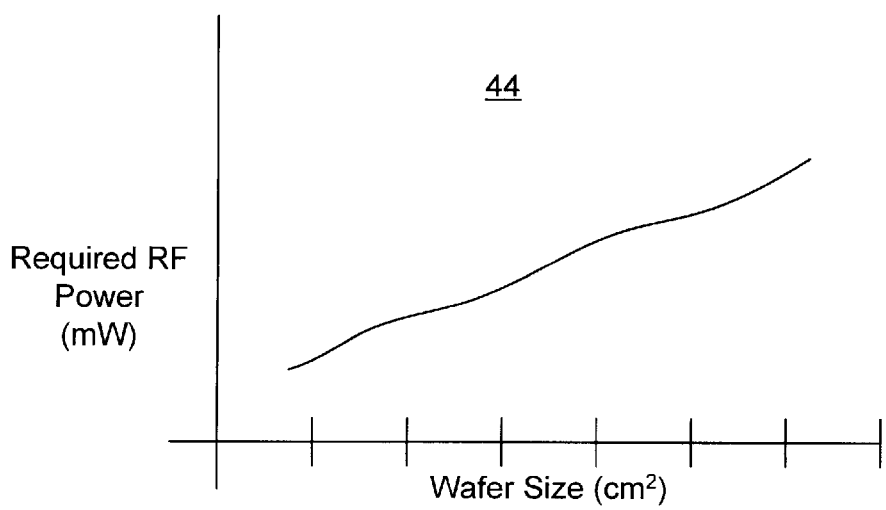
FIG. 3 is a plot showing the relationship between wafer size and required RF power, useful in understanding the invention.
Figure 4:
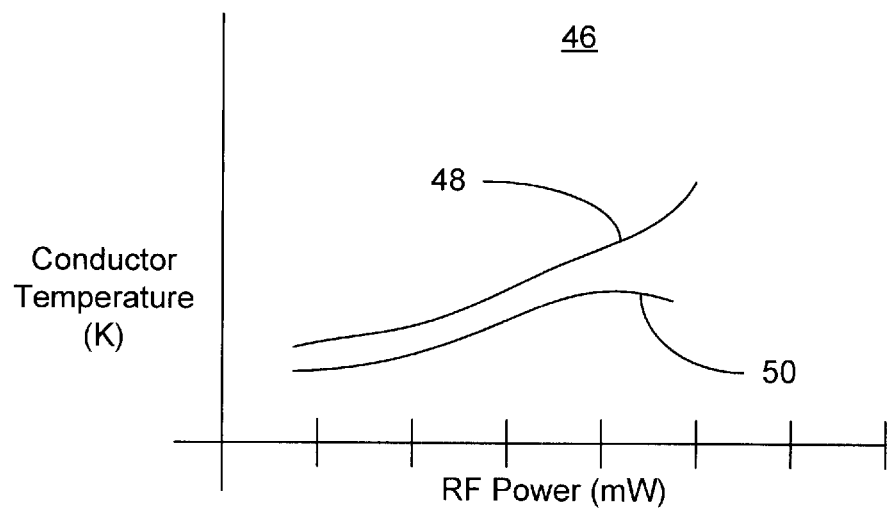
FIG. 4 is a plot showing the relationship between RF power and conductor temperature for a conventional bushing and a bushing in accordance with the present invention.

Turning now to FIG. 3, plot 44 demonstrates the gradual increase in required RF power as wafer size increases in response to industry demands and technological advancements. FIG. 4 illustrates in plot 46 the improvements in conductor temperature enabled by the present invention. Specifically, the Teflon curve 48 shows a rapid increase in conductor temperature as RF power increases. The ceramic curve 50, on the other hand, diverges significantly from the Teflon curve 48 as RF power is increased. It should be noted that boron nitride has a dielectric constant of 4, which is relatively close to the dielectric constant of Teflon. Thus, the present invention sacrifices very little in terms of electrical insulation in order to achieve the substantial benefits associated with thermal conductivity.

Figure 6:
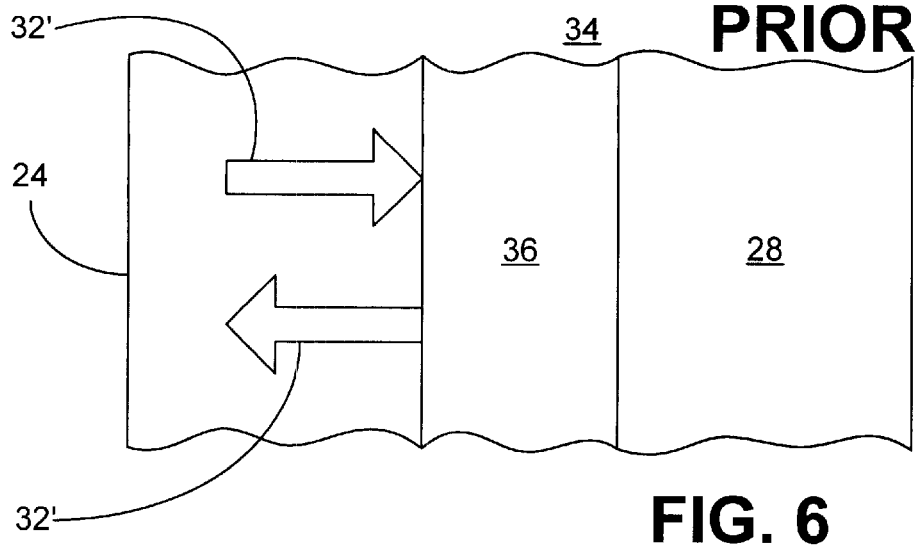
FIG. 6 is a sectional view of a probe interface illustrating heat flow when a conventional bushing is used.
Figure 7:
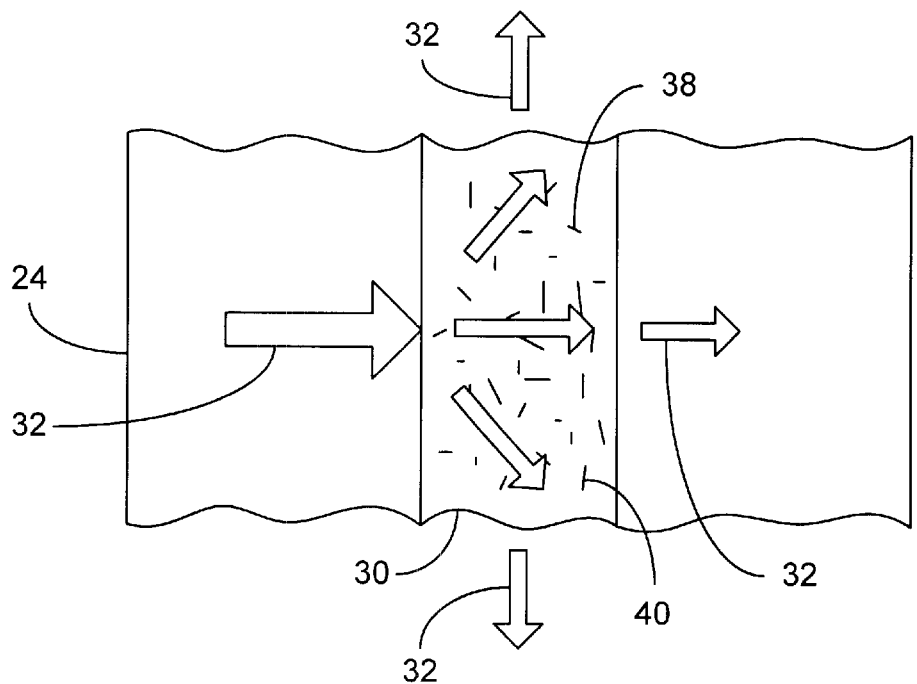
FIG. 7 is a sectional view of a probe interface illustrating heat flow when a bushing in accordance with the present invention is used.

FIGS. 6 and 7 demonstrate the effectiveness of the invention in greater detail. Specifically, FIG. 6 shows a conventional interface 34 wherein a thermally insulative bushing 36 having a material such as Teflon is disposed between the conductor 24 and the current pick-up board 28. In this case, the heat 32' is primarily contained within the conductor 24 due to the insulative properties of the bushing 36. As RF frequency and current increases, the conductor 24 will approach a temperature threshold at which thermal instability begins to affect the measurements made by the current pick-up board 28. FIG. 7, on the other hand, illustrates the improved approach of the present invention wherein the bushing 30 includes a thermally conductive material 38 and a binder material 40 dispersed throughout the conductive material 38. The materials 38, 40 combine to provide a predetermined level of thermal conductivity. The result is a dissipation of the heat 32 away from the conductor 24.

Figure 5:
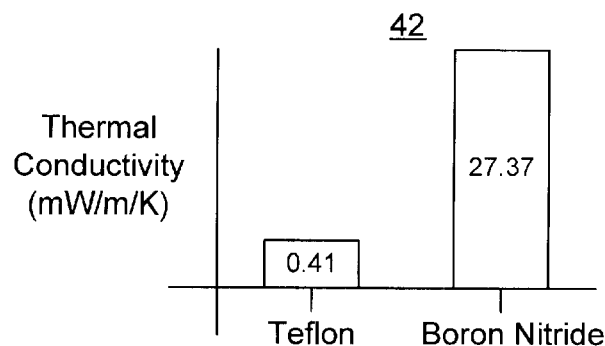
FIG. 5 is a chart illustrating thermal conductivity for a conventional bushing and bushing in accordance with the present invention.

FIG. 5 illustrates the significant difference in thermal conductivity with chart 42. Specifically, it can be seen that boron nitride, the presently preferred ceramic, has a thermal conductivity of approximately 27.37 watts per meter per degree Kelvin, whereas Teflon has a thermal conductivity of approximately 0.41 watts per meter per degree Kelvin.

It is important to note that although ceramic materials such as boron nitride have been discussed herein, any solid material that possesses the same relative thermal conductivity, dielectric strength and dielectric constant can be used. Notwithstanding, ceramic materials have proven to be quite effective in handling the higher frequency and current requirements of the semiconductor industry.

Those skilled in the art can now appreciate from the foregoing description that the broad teachings of the present invention can be implemented in a variety of forms. Therefore, while this invention can be described in connection with particular examples thereof, the true scope of the invention should not be so limited since other modifications will become apparent to the skilled practitioner upon a study of the drawings, specification and following claims.

What is claimed is:

1. A probe interface for a radio frequency (RF) probe head, the interface assembly comprising:

a conductor for transmitting RF power to a plasma chamber;

a sensing board for generating an analog signal based on the RF power; and an electrically insulative bushing disposed between the conductor and the sensing board, the bushing being thermally conductive such that the bushing dissipates heat resulting from the RF power.

2. The interface of claim 1 wherein the bushing includes:

a thermally conductive material; and a binder material dispersed throughout the conductive material;

said materials combining to provide a predetermined level of thermal conductivity.

3. The interface of claim 2 wherein the conductive material includes a ceramic material.

4. The interface of claim 3 wherein the ceramic material includes boron nitride.

5. The interface of claim 2 wherein the binder material includes calcium borate.

6. The interface of claim 2 wherein the predetermined level of thermal conductivity is approximately twenty-seven watts per meter per degree Kelvin.

7. The interface of claim 2 wherein the materials further combine to provide a dielectric constant of approximately four.

8. The interface of claim 1 wherein the sensing board is a voltage pick-up board such that the analog signal characterizes a voltage of the RF power.

9. The interface of claim 1 wherein the sensing board is a current pick-up board such that the analog signal characterizes a current of the RF power.

10. The interface of claim 1 wherein the dissipation of heat enables an increase in the RF power delivered to the plasma chamber.

11. A probe interface for a radio frequency (RF) probe head, the interface assembly comprising:

a conductor for transmitting RF power to a plasma chamber;

a sensing board for generating an analog signal based on the RF power;

a ceramic material; and a binder material dispersed throughout the ceramic material;

said materials combining to provide a predetermined level of thermal conductivity;

said materials forming an electrically insulative bushing disposed between the conductor and the sensing board, the bushing being thermally conductive such that the bushing dissipates heat resulting from the RF power;

said dissipation of heat enabling an increase of the RF power delivered to the plasma chamber.

12. The interface of claim 11 wherein the ceramic material includes boron nitride.

13. A method for measuring radio frequency (RF) power delivered to a plasma chamber, the method including the steps of:

transmitting the RF power to the plasma chamber via a conductor;

using a sensing board to generate an analog signal based on the RF power; and disposing an electrically insulative bushing between the conductor and the sensing board, the bushing being thermally conductive such that the bushing dissipates heat resulting from the RF power.

14. The method of claim 13 further including the steps of:

providing a thermally conductive material;

dispersing a binder material throughout the conductive material; and bonding the materials together such that the materials combine to provide a predetermined level of thermal conductivity.

15. The method of claim 14 further including the step of using a ceramic material as the conductive material.

16. The method of claim 15 further including the stop of using boron nitride as the ceramic material.

* * * * *

UNITED STATES PATENT AND TRADEMARK OFFICE
CERTIFICATE OF CORRECTION

PATENT NO. : 6,559,650 B2 Page 1 of 1
DATED : May 6, 2003
INVENTOR(S) : David J. Coumou It is certified that error appears in the above-identified patent and that said Letters Patent is hereby corrected as shown below:

<u>Column 2,</u>
Line 52, after "invention" delete "." and insert -- ; --.

<u>Column 6,</u>
Line 30, claim 16, "stop" should be -- step --.

Signed and Sealed this

Eighth Day of July, 2003

JAMES E. ROGAN
*Director of the United States Patent and Trademark Office*